(12) United States Patent
Brown

(10) Patent No.: US 7,817,965 B2
(45) Date of Patent: Oct. 19, 2010

(54) SCANNER WITH AUXILIARY NON-VOLATILE MEMORY

(75) Inventor: N. Craig Brown, Sterling, VA (US)

(73) Assignee: General Research of Electronics, Inc. (JP)

( * ) Notice: Subject to any disclaimer, the term of this patent is extended or adjusted under 35 U.S.C. 154(b) by 996 days.

(21) Appl. No.: 11/542,344

(22) Filed: Oct. 2, 2006

(65) Prior Publication Data

US 2007/0232287 A1 Oct. 4, 2007

Related U.S. Application Data

(63) Continuation of application No. 10/811,720, filed on Mar. 29, 2004, now abandoned.

(60) Provisional application No. 60/469,861, filed on May 12, 2003.

(51) Int. Cl.
*H04B 1/40* (2006.01)

(52) U.S. Cl. .......................... 455/77; 455/418; 455/434; 455/464

(58) Field of Classification Search ................. 455/418, 455/419, 432.1, 434, 557, 552.1, 77
See application file for complete search history.

(56) References Cited

U.S. PATENT DOCUMENTS

| | | |
|---|---|---|
| 5,842,124 A | 11/1998 | Kenagy et al. |
| 5,894,596 A | 4/1999 | Hayes, Jr. |
| 5,974,312 A | 10/1999 | Hayes, Jr. et al. |
| 6,018,656 A | 1/2000 | Shirai |
| 6,134,435 A | 10/2000 | Zicker et al. |
| 6,349,204 B1 | 2/2002 | Goetz et al. |
| 6,625,451 B1 | 9/2003 | La Medica, Jr. et al. |
| 2001/0005683 A1 | 6/2001 | Zicker et al. |
| 2002/0032023 A1 | 3/2002 | Lipsit |
| 2003/0224761 A1 | 12/2003 | Goto |

*Primary Examiner*—Temica M Beamer
(74) *Attorney, Agent, or Firm*—Clark Hill PLC

(57) ABSTRACT

A radio receiver having a plurality of features programmable by a user, the data relating to the programmable features defining a set-up configuration. The radio receiver includes a housing and an auxiliary memory disposed within the housing which stores a plurality of set-up configurations. A working memory is also disposed within the housing and is configured to store the set-up configuration in use by the radio receiver.

51 Claims, 9 Drawing Sheets

SCANNER WITH AUXILIARY NON-VOLATILE MEMORY

RELATED APPLICATION

This application is a continuation of U.S. patent application Ser. No. 10/811,720, filed on Mar. 29, 2004, which claims the benefit of U.S. Provisional Application No. 60/469,861, filed on May 12, 2003.

REFERENCE TO COMPACT DISCS (CD-R's) FILED WITH THE APPLICATION

Duplicate compact discs (CD-R's) have been filed with the present application as a computer program listing appendix. Each compact disc was created on Nov. 2, 2006 and contains the following file: "VScanner.asm" (77.4 kB, written in November of 2003). The material on the compact discs is incorporated herein by reference as a computer program listing appendix.

COPYRIGHT NOTICE

A portion of the disclosure of this patent application contains material (including files contained on the compact discs) which is subject to copyright protection. The copyright owner has no objection to the facsimile reproduction by anyone of the patent document or the patent disclosure, as it appears in the United States Patent and Trademark Office patent files or records, but otherwise reserves all copyrights whatsoever.

BACKGROUND OF THE INVENTION

This invention is generally directed to a portable or mobile scanning radio, also called a "scanner", although it is also applicable to radio receivers, and radio transceivers with internal memory for frequencies, and other operational settings or "set-ups".

A scanner is essentially a radio receiver, which is capable of quickly checking multiple radio frequencies for activity, and selectively stopping on a single frequency, to receive and demodulate a radio signal of interest. Typically, when a scanner is in a "scan mode", the scanner searches or scans for signals within a pre-selected range of frequencies or through a list of frequencies stored in internal memory. When a signal is located, typically the scanner is designed to stop scanning so that the user can listen to the signal, which is being received by the scanner. Typically, users are not interested in many of the signals which can be received by the scanner. For example, a user may only be interested in receiving signals relating to public service (police and fire department), but not relating to marine or aviation activity. Generally, scanners include the ability to program particular frequencies to be scanned. The user can, therefore, program the desired frequencies relating to, for example, public service communications into his scanner. Now when the scanner performs its scanning function, the list of frequencies related to public service communications will be stored in the scanner's memory and the scanner will only scan the pre-programmed frequencies relating to public service communications. If a user later decides he would like to listen to different signals, for example, signals used by race car drivers at a race, the user can then enter the race car frequencies to be scanned into the scanner. When this new list of race car frequencies is entered into the scanner, very often, the old list of public service communications frequencies is removed from the scanner's memory, i.e. the scanner's memory is rewritten.

Beside frequency lists, many other features can be selected on a typical scanner. The entirety of the frequencies, and other programmable features are referred to as a "set-up". Some of these set-up features include: frequency ranges for searches, channel talk-group identifications, channel lockout status, contrast settings, etc. A particular scanner set-up is comprised of, and defined by, the selections made for each of these features. Each of the settings can be changed and set as desired by the particular user. The set-up is saved in the scanner's working non-volatile memory so that when the scanner is turned on and off the set-up information is not lost. Some scanners include thousands of settings (including frequencies and frequency labels), which can be set by a user. Therefore, achieving a desired set-up for these scanners can be a lengthy and tedious process. In addition, if a user wants to temporarily alter the set-up, and use the previously entered settings, the user must spend a substantial amount of time to create a new set-up and then spend time and effort to achieve the previous set-up again. A common example of a practical reason to change between multiple set-ups may be due to travel. A user may have the scanner set for his local geographical area, and may then travel to other areas that use completely different frequencies, and labeling for these frequencies and talk-groups. It is very common that each separate geographical area will require a unique set-up to address the user's listening goals for that particular area.

A method which has been used to alleviate the time and effort involved with programming and reprogramming the scanner set-up involves use of a personal computer. Through the use of the memory and file system in a personal computer, the particular settings chosen by a user can be saved as a set-up file to be used repeatedly. With this method, as shown in FIG. 1, a cable 10 is provided between a scanner 14 and a personal computer 12. The scanner 14 includes working memory 16. The computer 12 includes memory or other storage media 18 in which multiple set-up files 19 are stored. Special software created to upload and download set up files 19 and to save and delete set up files 19 is loaded on the computer 12. With the computer 12 attached to the scanner 14, the user can, for example, download a first configuration from the working memory 16 of the scanner 14 to the memory 18 of the computer 12. The first configuration is saved, for example, as set-up file 19a. The user can then alter the settings of the scanner 14 and save the second configuration within the scanner's working memory 16. Using the software on the computer 12, the second configuration can then be transferred to the memory 18 of the computer 12. The second configuration is saved, for example, as set-up file 19b. The memory 18 of the computer 12 is capable of storing multiple set-up files, so that when a user desires a particular arrangement of settings, the related set-up file can be selected from the computer 12 and uploaded to the scanner's working memory 16.

This prior art method of saving multiple set-up files on a computer allows a user to quickly change the settings on the scanner without the tedious repetitive manual entry required through use of the scanner user interface (keyboard and display) alone. However, a disadvantage of this method is that it requires the user to have access to a personal computer, and interface hardware (i.e. cable or docking port) in order to effectuate the changes to the scanner's working memory. Not only is this costly, but it can also be cumbersome to transport the personal computer and interface hardware, even if, for example, a lap top personal computer is used.

The present invention overcomes at least some of the problems presented in the prior art and provides additional advantages over the prior art, such advantages will become clear upon a reading of the attached specification in combination with a study of the drawings.

OBJECTS AND SUMMARY OF THE INVENTION

A general object of an embodiment of the present invention is to provide a scanner, which is capable of storing multiple set-up files internally without any external connections or accessories.

An object of an embodiment of the present invention is to provide a scanner, which is capable of accessing and managing multiple internal set-up files.

Another object of an embodiment of the present invention is to economically provide a scanner, which can store multiple set-up files internally.

Still another object of an embodiment of the present invention is to provide a convenient and efficient method of storing multiple copies of a radio's working memory.

Briefly, and in accordance with the foregoing, an embodiment of the present invention provides a scanner, which includes a working memory, an auxiliary memory, and a user interface. Multiple set-up folders, which contain set-up data, are stored within the auxiliary memory. The user interface is driven by a microprocessor provided within the scanner and allows a user to select which set-up folder is to be used by the working memory. The user interface allows performance of common functions, such as, for example, load, save, delete, copy, and move to manage the internal set-up folders. Preferably, the invention is realized through modern high capacity flash memory chips, and a software program that runs on a microprocessor, which facilitates the practical use, and management of the working and auxiliary memories.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENTS

Figure 1:
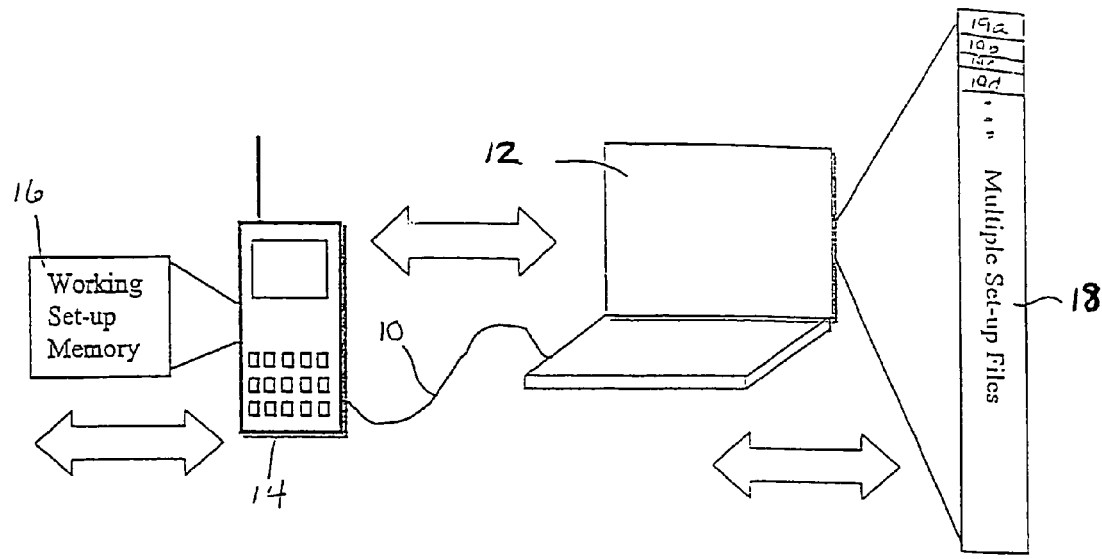
FIG. 1 represents a prior art scanner along with a personal computer, which is used to download and upload set-up files from the personal computer to the scanner through external connection cables.

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

Figure 8:
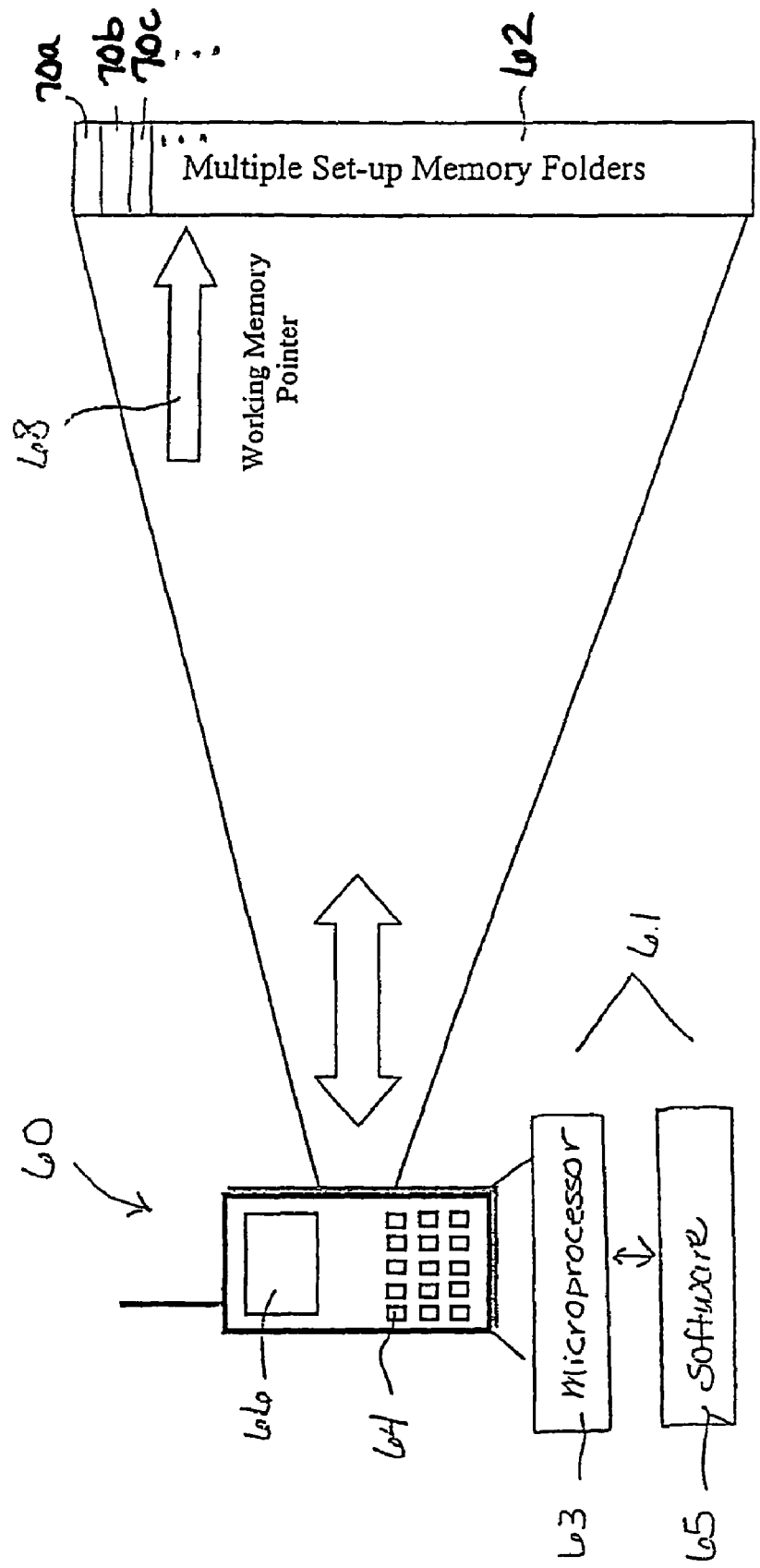
FIG. 8 is a diagram which represents a scanner which incorporates the features of a second embodiment of the invention.
Figure 9:
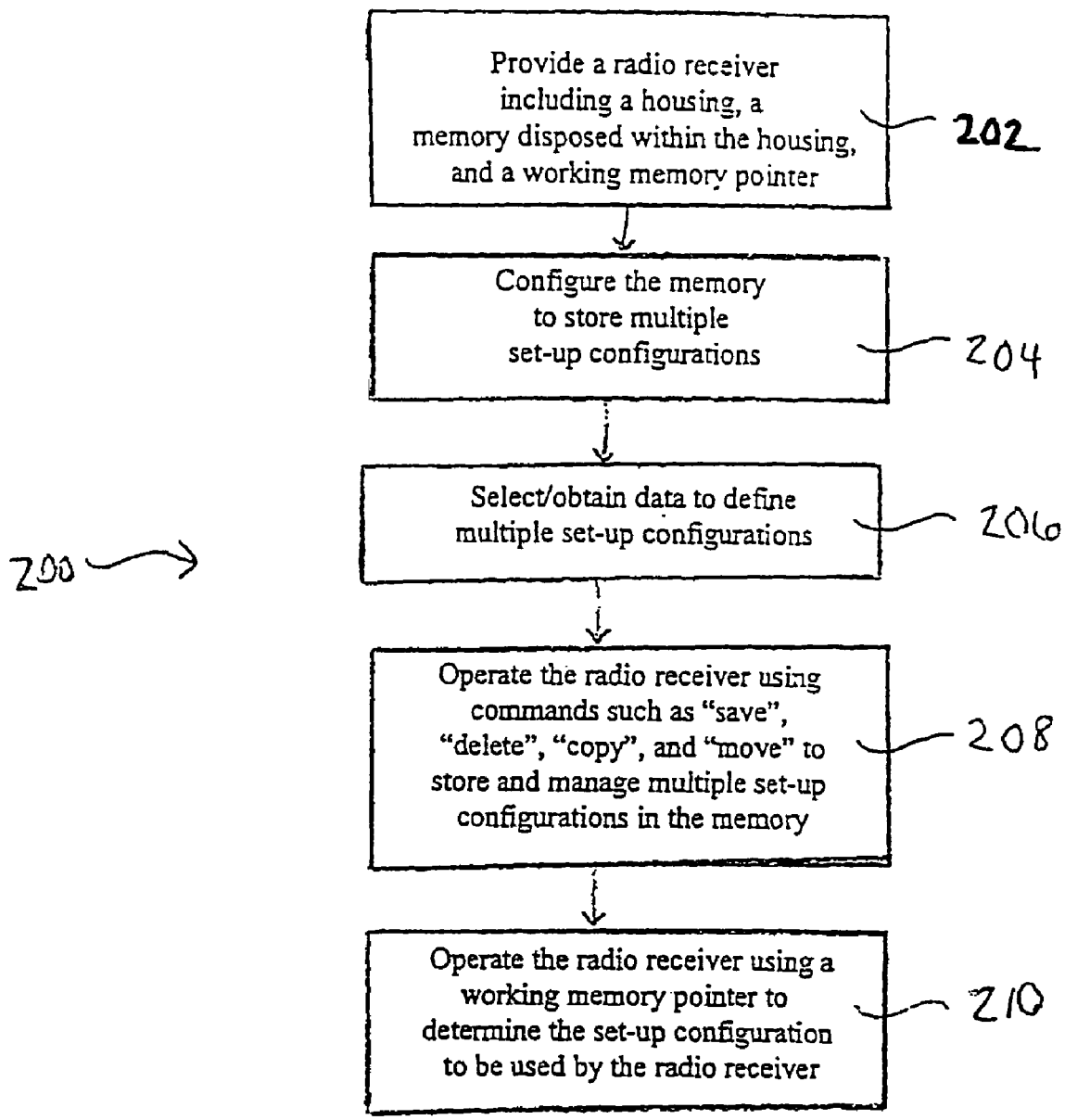
FIG. 9 is a block diagram illustrating the steps for managing a plurality of set-up configurations using the scanner of FIG. 8.

A scanner which is in accordance with a first embodiment of the present invention is illustrated in FIGS. 2-7 while a scanner in accordance with a second embodiment of the present invention is illustrated in FIGS. 8-9. Both embodiments provide a scanner which is capable of storing, accessing and managing multiple set-up files internally without any external connections or accessories.

Figure 2:
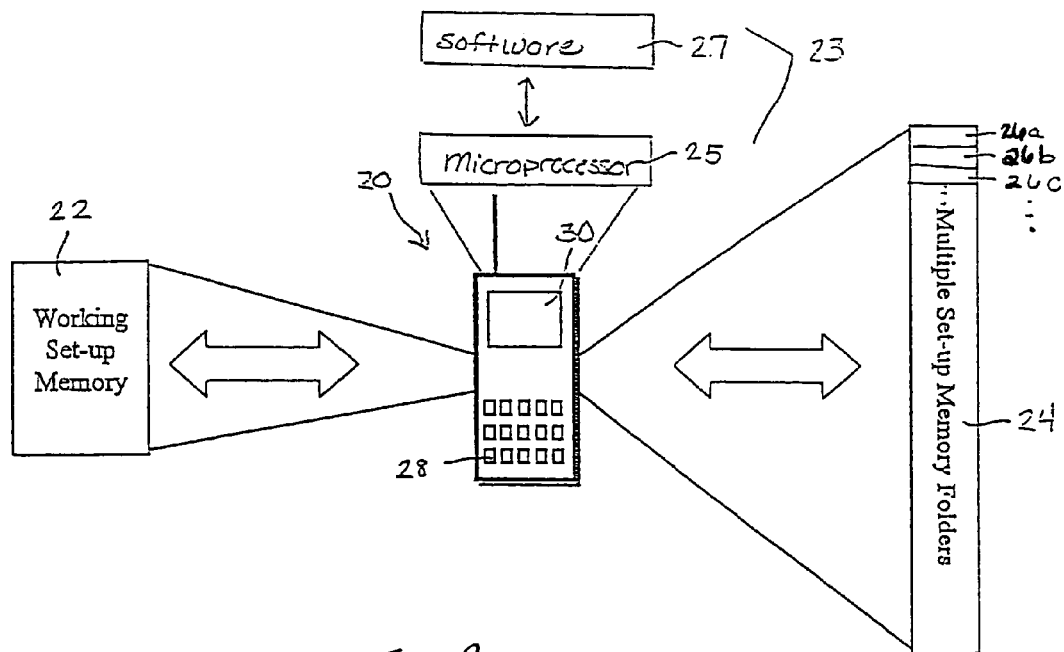
FIG. 2 is a diagram which represents a scanner which incorporates the features of a first embodiment of the invention.

As illustrated in FIG. 2, the scanner 20 which is in accordance with a first embodiment of the present invention includes working memory 22, auxiliary memory 24, a user interface 23, keys 28 and a display 30.

The working memory 22, also referred to as the set-up memory, is located within the scanner 20. Preferably, the working memory 22 is of a non-volatile type, such as, for example an EEPROM type. Thus, the contents of the working memory are not lost when the power is removed from the scanner 20.

Preferably, the working memory 22 includes approximately 100 software settable features and hundreds or thousands of operator set features. These operator set features preferably include, for example: frequencies, frequency ranges for searches, memory labels, talk-group identifications, and settings (flags) establishing which of the multitude of frequencies are to be scanned. The selection of the settings, or set-up configuration, encompasses the entire scanner configuration (set-up), such as, the frequency configurations and the display configurations. A particular set-up may be useful, for example, for a specific geographic area. Another set-up may be tailored for a particular type of listening, for example, public service fire/police frequencies, but not amateur radio or aviation frequencies.

The auxiliary memory 24 is also preferably located within the scanner 20 and may be controlled by the same or a different microprocessor that controls the working memory 22. Preferably, the auxiliary memory 24 is a non-volatile type, such as, for example, a "FLASH" type. Thus, the contents of the auxiliary memory 24 are not lost when the power is removed from the scanner 20. Although is has been stated that the working memory 22 and auxiliary memory 24 are of the non-volatile type, it is possible due to the advantages of this invention that the working memory 22 may be of volatile type (RAM). Such volatile memory is automatically refreshed on initial microprocessor boot, in a fashion not apparent to the user, from the non-volatile auxiliary memory 24.

The auxiliary memory 24 provides a location for storing multiple set-up folders 26. Each set up folder 26 is capable of storing the set-up configuration data associated with the working memory 22.

The user interface 23 includes a microprocessor 25 and software 27. The microprocessor 25 drives the software 27. The user interface 23 is internal to the scanner 20 and provides communication between the radio user, the working memory 22 and the auxiliary memory 24. The user interface 23 provides menus and prompts which allow the scanner user, through the keys 28 and display 30, to accomplish the directed and convenient transfer of set-up data between the working memory 22 and the auxiliary memory 24 and to manage the multiple set-up folders 26 in the internal non-volatile memory 24. A copy of the code relating to the software 27 is submitted herewith on compact disc as a computer program listing appendix. It is to be understood that the code can be provided in variety of ways to carry out the functions of the user interface and that the code provided in the appendix is only one example.

Figure 3A:
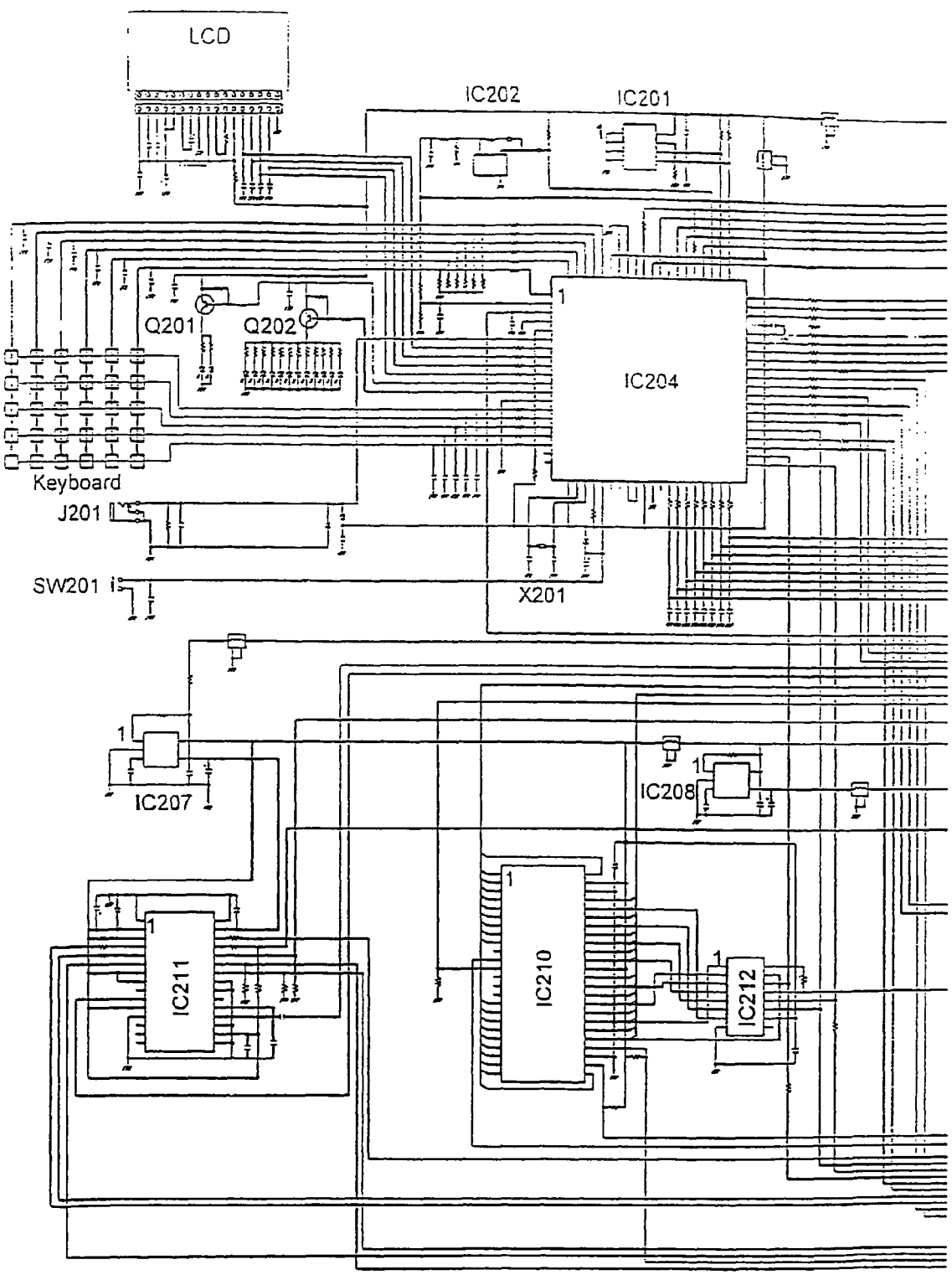
FIG. 3a is an electrical schematic illustrating a portion of a preferred embodiment of the electrical circuitry of the scanner represented in FIG. 2.
Figure 3B:
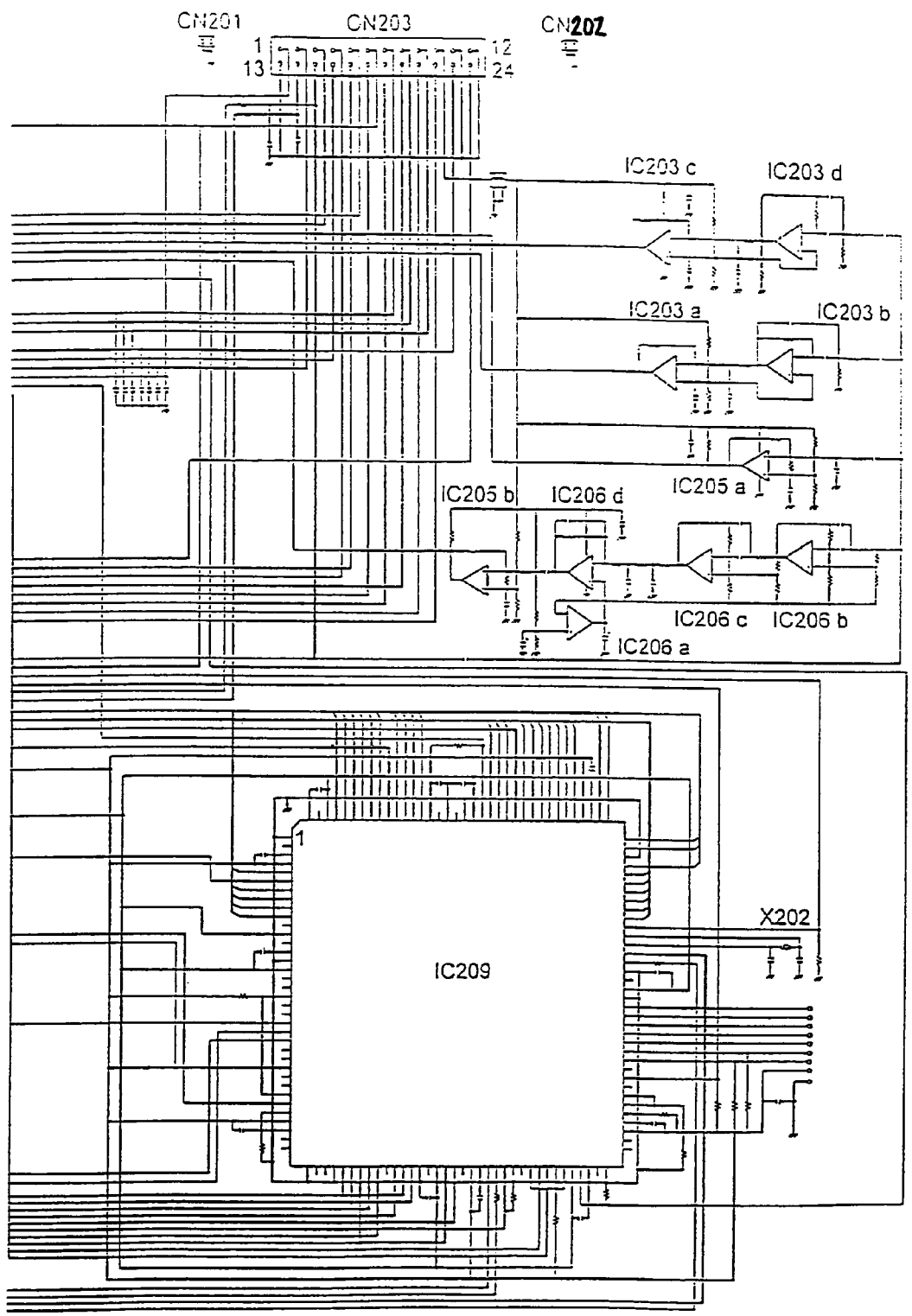
FIG. 3b is an electrical schematic illustrating another portion of a preferred embodiment of the electrical circuitry of the scanner represented in FIG. 2.
Figure 4:
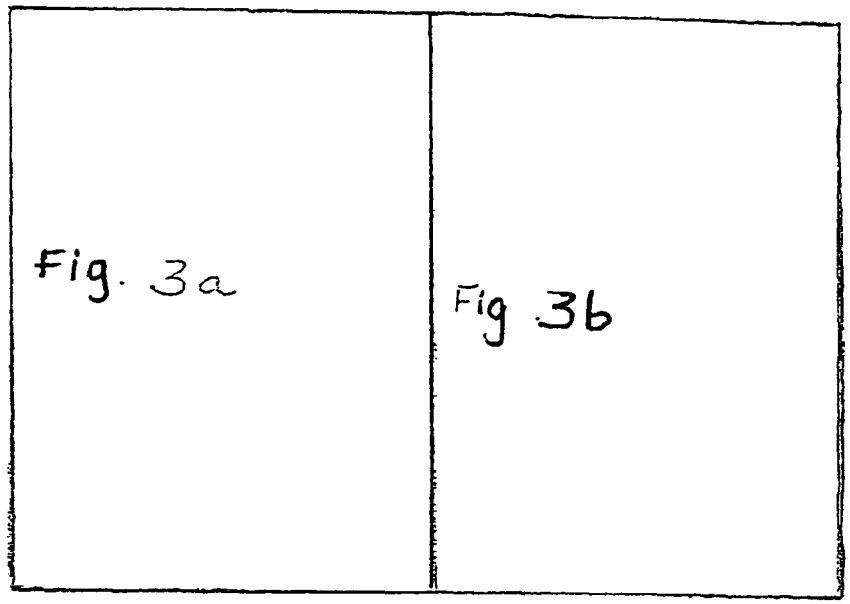
FIG. 4 is a block diagram illustrating alignment of FIG. 3a with respect to FIG. 3b.

FIGS. 3a and 3b provide a schematic diagram of a logic circuit section of the preferred electrical circuitry in accordance with the first embodiment of the invention. As shown in FIG. 4, the diagram is aligned by placing FIG. 3a to the left of FIG. 3b. As shown in FIGS. 3a and 3b, the working memory 22 is provided by IC201, the auxiliary memory 24 is represented by IC210, the microprocessor 25 is represented by IC204 and IC209, the display 30 is represented by LCD, and the keys 28 are represented by the Keyboard.

Figure 6:
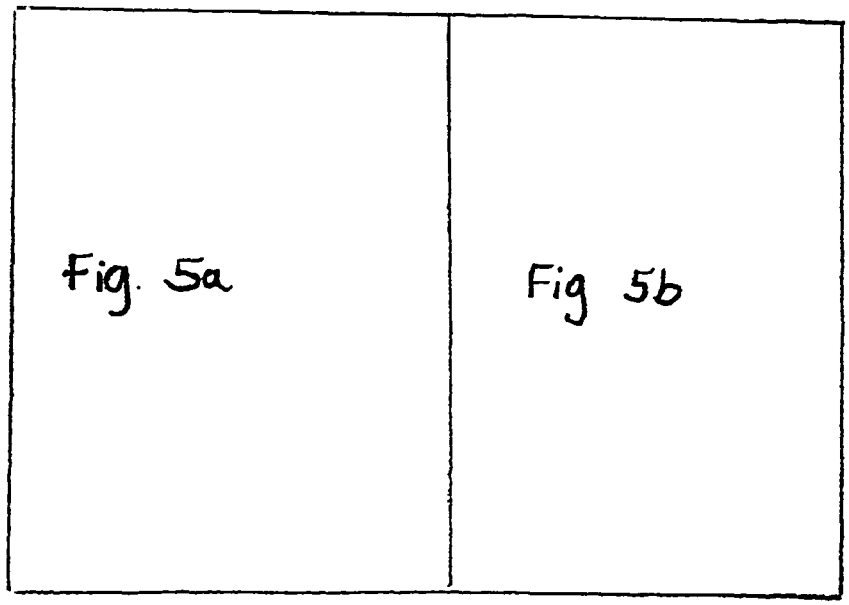
FIG. 6 is a block diagram illustrating alignment of FIG. 5a with respect to FIG. 5b.
Figure 5A:
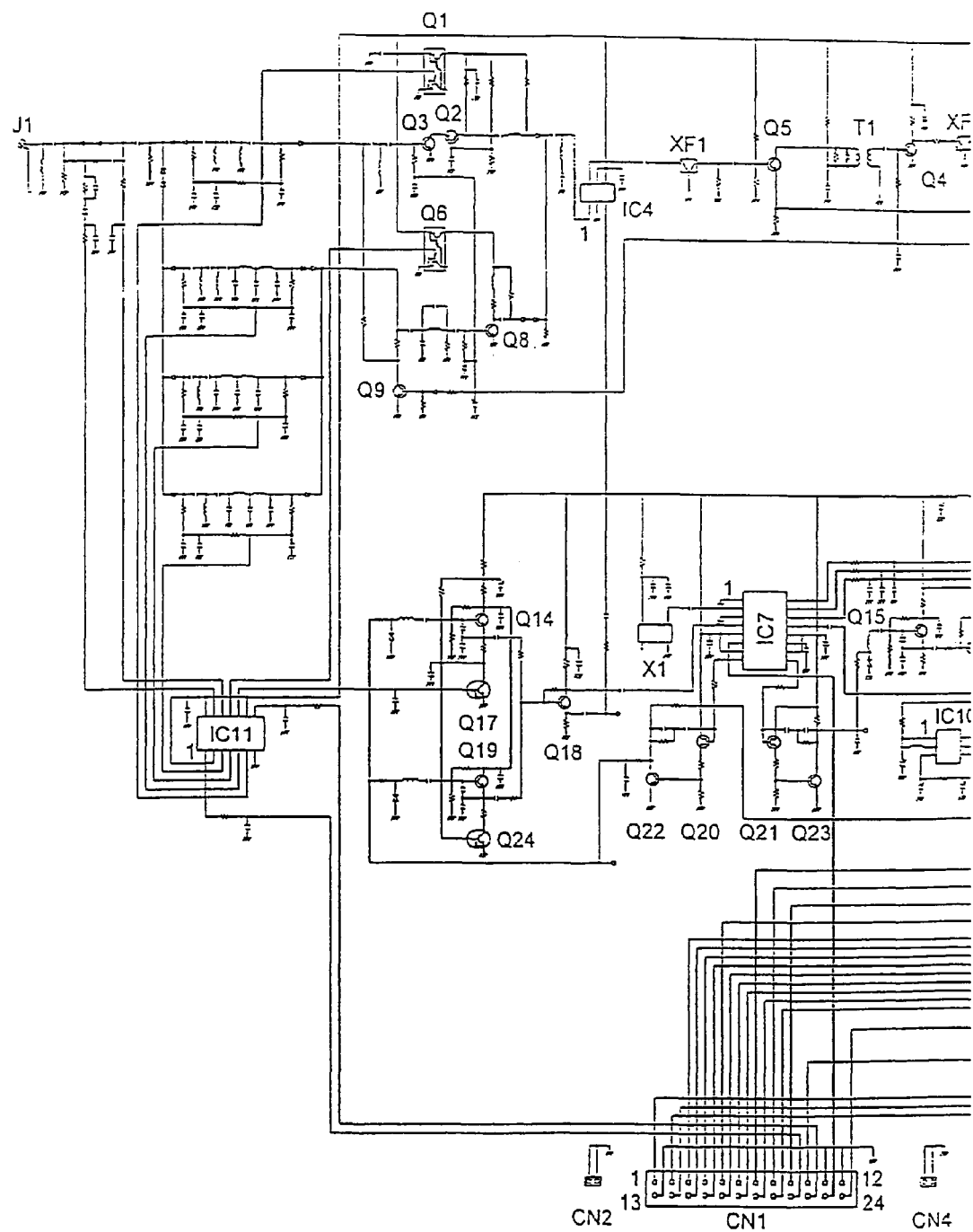
FIG. 5a is an electrical schematic illustrating a portion of a preferred embodiment of the electrical circuitry of the scanner represented in FIG. 2.
Figure 5B:
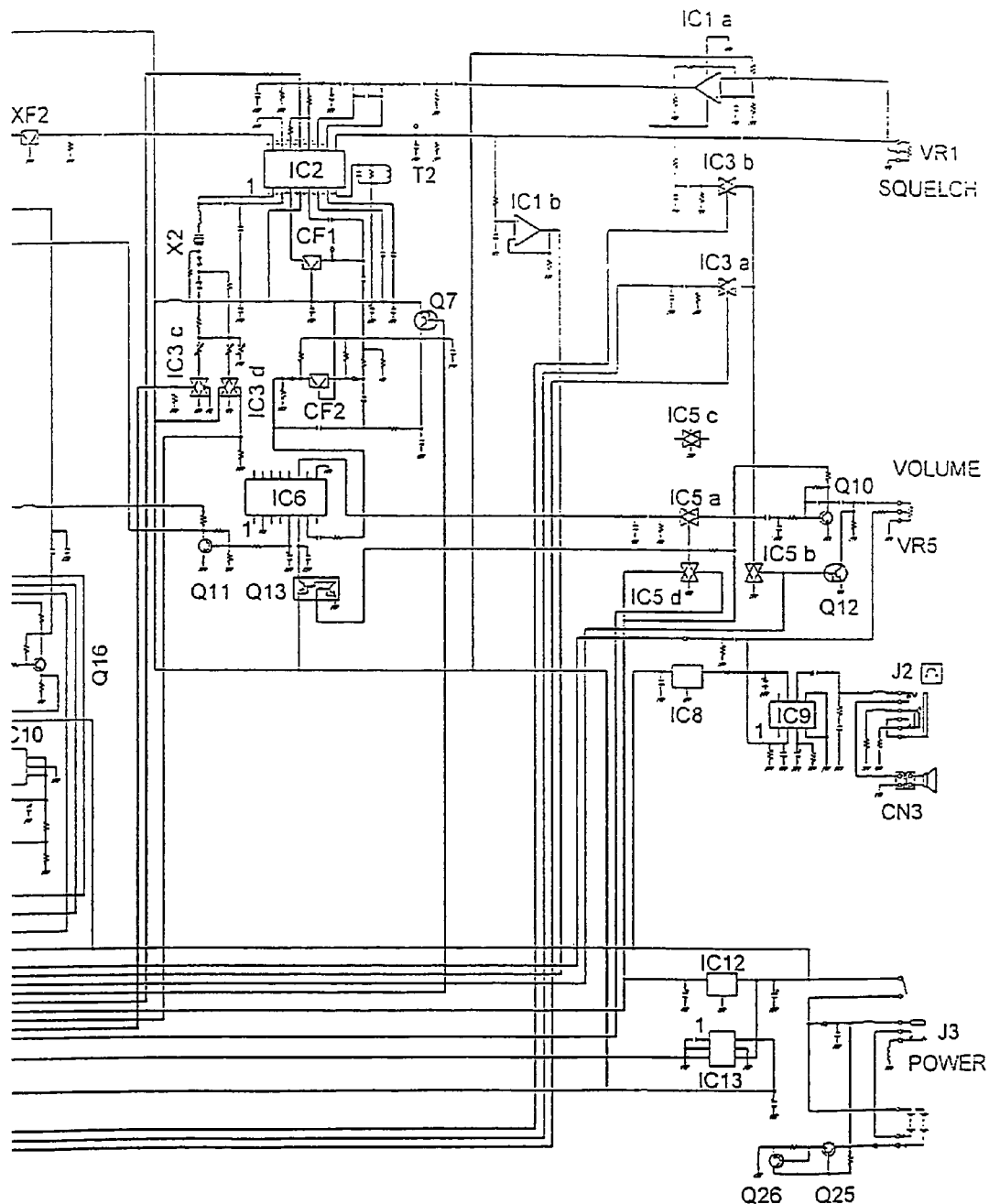
FIG. 5b is an electrical schematic illustrating another portion of a preferred embodiment of the electrical circuitry of the scanner represented in FIG. 2.
Figure 7:
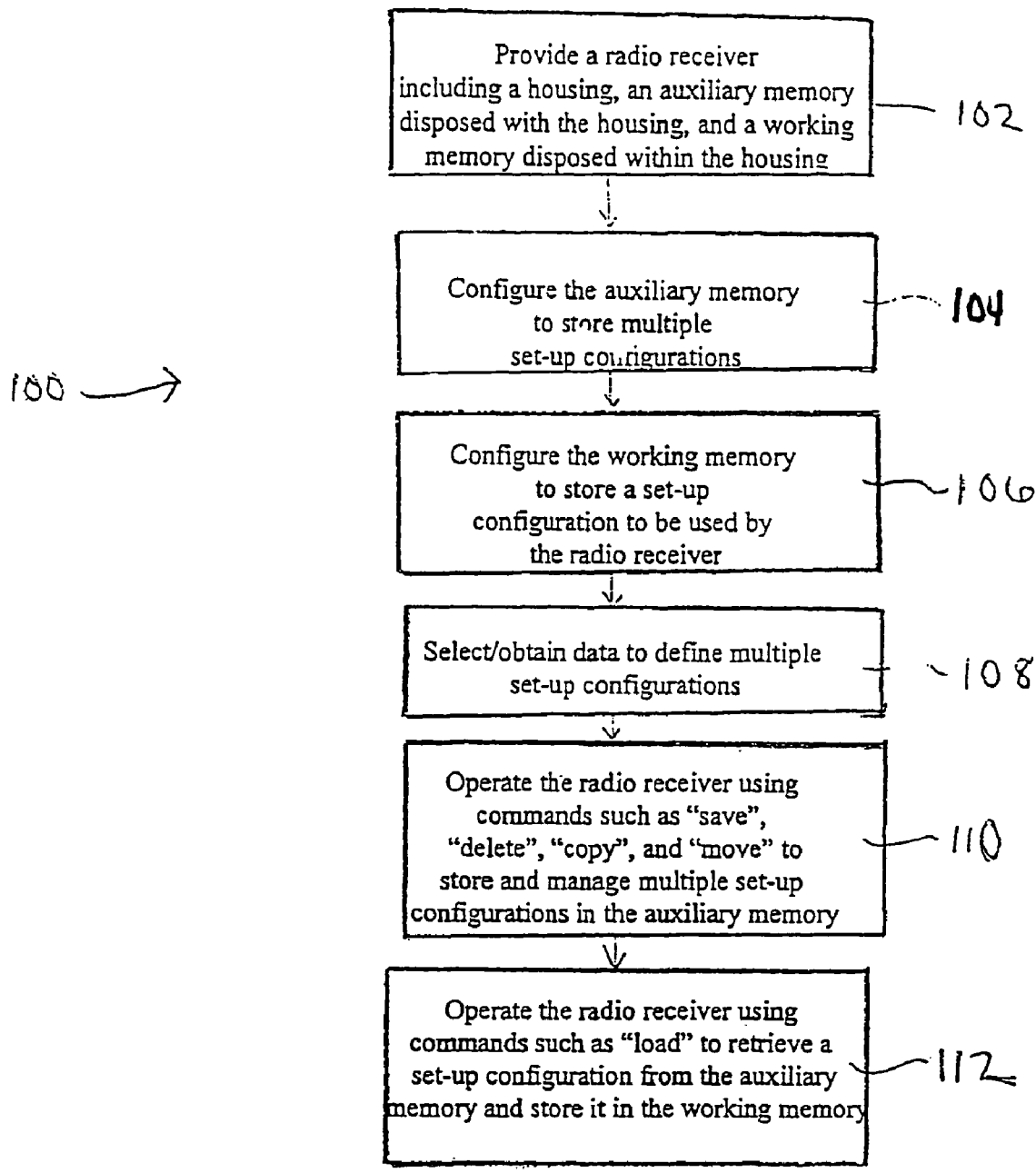
FIG. 7 is a block diagram illustrating the steps for managing a plurality of set-up configurations using the scanner of FIG. 2.

FIGS. 5a and 5b provide a schematic diagram of a linear circuit section of the preferred electrical circuitry in accordance with the first embodiment of the invention. As shown in FIG. 6, the diagram is aligned by placing FIG. 5a to the left of FIG. 5b. Connection is provided between the logic circuit section and the linear circuit section as follows: CN201 of the logic circuit section is connected to CN2 of the linear circuit section; CN203 of the logic circuit section is connected to CN1 of the linear circuit section; and CN202 of the logic circuit section is connected to CN4 of the linear circuit section.

Particular examples for using the radio receiver 20 will now be described. If, for example, a user wants to temporarily alter the set-up configuration, the user can first save the current working set-up configuration from working memory 22 to a set-up folder 26, for example, specifically set-up folder 26a through the use of the microprocessor 25, and software 27. The user may then modify the set-up configuration data in the working memory 22 of the scanner 20. When the user wants to use the previous set up configuration from set up folder 26a, the set up configuration data currently in the working memory 22 can be transferred to a folder, for example set up folder 26b of the auxiliary memory 24. Next, the data from set up folder 26a can be reloaded into the working memory 22. The user interface 23 allows for each folder to be labeled alphanumerically for the convenience of the scanner user. Additionally, the software 27 keeps track of which folders 26 may be empty, and upon query from the user, will display the empty status to provide a further convenience to the user. Thus, data regarding each scanner feature is stored within each set-up folder 26.

When the user, through the user interface 23, loads a folder 26 to the working memory 22, all of the settings relating to the scanner's features are restored to that of the saved features in the folder 26. For example, a user may first configure the scanner 20 so that he can listen to aircraft and the park service frequencies. In addition, he may like darker contrast on the display 30, and no Automatic Gain Control (AGC) on the audio. A second configuration defined by the user, may include fire and police frequencies with audio AGC activated, and long post-squelch-drop delays. The microprocessor and software user interface allows for each configuration to be stored in a folder 26a or 26b in auxiliary memory 24. When a particular configuration folder is chosen, through the use of the user interface 23, the desired set-up folder 26n is loaded into the working memory 22. Preferably, this operation is performed nearly effortlessly and can be completed within a matter of seconds. If the user later wants to modify the configuration of a particular set-up, the user can move the configuration data set-up from the working memory 22 to a memory folder 26. With the previously saved options now transferred from the working memory 22 to a memory folder 26, the working memory 22 is thereafter available for erasure, or modification, storing new data regarding the user's new configuration.

Unlike the prior art, no external connection to a computer, or associated cable or docking port, is required. The user interface functions are designed in such a way to be easy to understand, and prompt the user through each step of the functions. Examples of the steps performed by a user to carry out these functions will now be described. For example, if a user chooses to save a particular set-up configuration, the scanner 20 can be configured such that the user simply follows the following steps. The user access a menu of functions by pressing the following sequence of keys "PGM", "FUNC" "PGM". In response, the scanner 20 will provide the user with a list of options including: "1-Save", "2-Load", "3-Delete" or "CL-Exit". The user selects the desired option by pressing the appropriate key, i.e. 1, 2, 3, or CL, associated with desired function as displayed. If the user does not want to save, load, or delete a set up configuration, the function can be aborted by pressing the "CL" key. If for example, the user desires to save the particular configuration, the user presses the "1" key. The user will then be prompted through the display 30 to confirm that the configuration is to be saved. For example, the user will be asked to press the "enter" key to save the configuration or to press the "CL" key to abort or exit the operation. The user is then asked to identify the folder in which the configuration is to be stored. The user identifies the folder using the keys 28. If the particular folder identified by the user is not empty, the user will be asked to confirm that the previous data stored in the folder should be overwritten. If the user does not want to overwrite the previous data stored in the folder the user can chose another folder in which the configuration can be saved.

The user interface 23 also warns the user of any possible non-reversible operation, e.g. "delete", and requires a second confirmation key press before the non-reversible operation is initiated. A status indication on the display 30 is provided while a function is performed by the microprocessor 25 so the user may know that the selected function is progressing normally. Once the microprocessor 25 and software 27 determine that a function is complete, the display 30 will indicate the completion of the function, and require a confirming key press on keypad 28 before additional functions are allowed. Preferably, the user interface 23 allows the set up folders 26 to be managed with the following commands: save, load, delete, copy and move. For example, the command "save" refers to storing data from the working memory 22 to a set-up folder 26. The command "load" refers to retrieving set-up data from a memory folder 26 and placing that data in the working memory 22. The command "delete" refers to erasing data (an individual folder) from the auxiliary memory 26. The command "copy" refers making an exact copy from one folder in auxiliary memory 26 to another folder in auxiliary memory 26. The command "move" refers to making an exact copy of one folder in auxiliary memory 26 to another folder in auxiliary memory 26, and then deleting the contents of the source folder of the copy.

The scanner 20 can be used in a variety of ways to provide improved functionality and convenience to the user. A diagram, which generally represents a method of using the scanner 20, is provided in FIG. 7. As represented by step 102 in FIG. 7, the method begins by providing a radio receiver including a housing, an auxiliary memory disposed within the housing, and a working memory disposed within the housing. Next, as represented by steps 104 and 105, the auxiliary memory is configured to store multiple set-up configurations and the working memory is configured to store a set-up configuration to be used by the radio receiver. As represented by the step 108, the user then obtains or selects data to define multiple set-up configurations. As represented by step 110, the user then operates the radio receiver to store and manage the data relating to multiple set-up configurations within the auxiliary memory. Finally, as represented by step 112, the user operates the radio receiver to retrieve a set-up configuration from the auxiliary memory and store the particular set-up configuration within the working memory. It is to be understood that it is not necessary to perform the steps shown in FIG. 7 in the particular sequence provided.

A scanner 60 in accordance with a second embodiment of the present invention is shown in FIG. 8. As shown, the scanner 60 includes a user interface 61, an auxiliary memory 62, keys 64, a display 66 and a working memory pointer 68. The scanner 60 is similar to the scanner 20, however, a separate working memory is not provided within the scanner 60.

The user interface 61 includes a microprocessor 63 and software 65. The microprocessor 63 drives the software 65.

The auxiliary memory 62 is located within the scanner 60. Preferably, the auxiliary memory 62 is of the FLASH type. The auxiliary memory 62 provides a location for storing multiple set-up folders 70. Each set up folder 70 is capable of storing the set-up configuration data. A software working memory pointer 68 is used to determine which particular set-up folder 70 is to be activated and used by the microprocessor 63 in scanner 60. With this second embodiment, it is not necessary to delineate the actual hardware memory into separate integrated circuits, or the software operational concept of working, and auxiliary memories. It is possible for the microprocessor 63 and software 65 to use any folder 70 in auxiliary memory 62 directly, as if it were the working memory of the previous embodiment.

It is additionally possible for the microprocessor 63 and software 65 to scan a list of auxiliary memory folders 70 in sequence or individually via a list that is part of the scanner 60 set-up. This second embodiment allows for a more cost effective implementation of the disclosed invention by using only one hardware memory device. In this embodiment, the software operation of "load" just changes the location of the pointer 68, so no actual transfer of set-up data is performed.

A diagram representing a general method 200 of using the scanner 60 is provided in FIG. 9. The method begins with step 202 in which a radio receiver is provided including a housing, a memory disposed within the housing, and a working memory pointer. Next, as represented by step 204, the memory is configured to store multiple set up configurations. As represented by step 206, the user then selects or obtains data to define multiple set-up configurations. As represented by step 208, the user then operates the radio receiver to store and manage multiple set-up configurations in the memory. Finally, as represented by step 210, the user then uses the working memory pointer to determine the set-up configuration to be used by the radio receiver.

A schematic diagram of the electrical circuit of the scanner 60, is similar to the schematic diagrams of FIGS. 3a, 3b, 5a, 5b, however, the schematic diagram of the scanner 60 does not include IC201 which represent the working memory 22 of the scanner 20.

As with the first embodiment, no external connection to a computer, or associated cable or docking port, is required in connection with the scanner 60. The user interface functions are designed in such a way to be easy to understand, and prompt the user through each step of the functions. Preferably, the steps performed by the user to operate the interface functions are similar to the steps performed in connection with the scanner 20 described above.

Each of the embodiments of the scanner described above allows the user to save a set up configuration in a set-up folder as implemented by the microprocessor and software. Once the set-up configuration has been entered and saved, recall of the set up configuration is essentially effortless by virtue of the menu driven nature of the user interface. Because each scanner includes non-volatile, auxiliary memory within the scanner itself, along with a microprocessor and software, it is not necessary to use a personal computer or associated cables or docking port to access and alter the set-up configurations. Thus, this invention provides a single easily portable unit, which can easily be reconfigured as desired by the user. Each embodiment described above will still allow the folders to be fully accessible (load, save, delete, copy, move) by a personal computer via an industry standard interface (e.g. RS-232 or USB) such that the working memory, and or auxiliary memory folders may be managed via the personal computer for additional convenience. Although the management of the scanner working and auxiliary memory by personal computer is supported, the use and management of the scanner memory does not require the use of the personal computer, cables, or docking ports, as the microprocessor, non-volatile memory, and software feature set, as described in this disclosure is preferably internal to the scanner radio. Thus, the cost of a scanner in accordance with the present invention is less expensive that the cost of the combination of a prior art scanner, a personal computer, and a cable.

While preferred embodiments of the present invention are shown and described, it is envisioned that those skilled in the art may devise various modifications of the present invention without departing from the spirit and scope of the invention.

The invention claimed is:

1. A scanning radio receiver for scanning a plurality of radio frequencies and tuning said scanning radio receiver to each of said frequencies and, when an audio signal is detected for any one of said radio frequencies, remaining tuned to that frequency for a period of time and processing said audio signal to cause said scanning radio receiver to play said audio signal for said period of time, said scanning radio receiver having a plurality of user-programmable operating functions, said scanning radio receiver comprising:

a housing;
a working, non-volatile memory disposed in the housing;
an auxiliary, non-volatile memory disposed in said housing;
a user interface on said housing which is user operable to program functions of the scanning radio receiver, to define a first operating configuration, and store the first operating configuration in said working memory, wherein the user interface is user operable to program functions of the scanning radio receiver to define a second operating configuration, and store the second operating configuration in said auxiliary memory simultaneously with said first operating configuration being stored in said working memory, wherein the user interface is user operable to select between the first and second operating configurations, wherein each operating configuration comprises a set of scanning radio receiver functions which have been programmed by the user using the user interface, wherein the scanning radio receiver is workable using either the first or second operating configuration, but the user interface is useable to select which of the first and second operating configurations is used by the scanning radio receiver.

2. A scanning radio receiver as recited in claim 1, wherein each of the operating configurations comprises a user-selected set of frequencies to be scanned by the scanning radio receiver when that particular operating configuration is selected by the user.

3. A scanning radio receiver as recited in claim 1, wherein each of the operating configurations comprises at least one range of frequencies to be scanned by the scanning radio receiver when that particular operating configuration is selected by the user.

4. A scanning radio receiver as recited in claim 1, wherein each of the operating configurations comprises memory labels which are in use when that particular operating configuration is selected by the user.

5. A scanning radio receiver as recited in claim 1, wherein each of the operating configurations comprises talk-group identifications which are in use when that particular operating configuration is selected by the user.

6. A scanning radio receiver as recited in claim 1, wherein the scanning radio receiver is configured such that the user interface is useable to delete configurations from said working memory and said auxiliary memory.

7. A scanning radio receiver as recited in claim 1, wherein the scanning radio receiver is configured such that the user interface is useable to move configurations in said working memory and said auxiliary memory.

8. A scanning radio receiver as recited in claim 1, further comprising:
a microprocessor disposed within said housing and in communication with said working memory and said auxiliary memory, and wherein said microprocessor is configured such that the user interface is useable to manage a plurality of operating configurations stored in said working memory and said auxiliary memory.

9. A scanning radio receiver as recited in claim 1, wherein said working memory and said auxiliary memory comprises an EEPROM.

10. A scanning radio receiver as recited in claim 1, further comprising a pointer which points at the selected operating configuration which is stored in said working memory and said auxiliary memory.

11. A scanning radio receiver as recited in claim 1, wherein the scanning radio receiver is non-telephonic.

12. A scanning radio receiver as recited in claim 1, wherein the scanning radio receiver is configured to check radio frequencies for activity, stop on a single frequency, and receive and demodulate a radio signal on the single frequency without transmitting on any frequency.

13. A scanning radio receiver for scanning a plurality of radio frequencies and tuning said scanning radio receiver to each of said frequencies and, when an audio signal is detected for any one of said radio frequencies, remaining tuned to that frequency for a period of time and processing said audio signal to cause said scanning radio receiver to play said audio signal for said period of time, said scanning radio receiver having a plurality of user-programmable operating functions, said scanning radio receiver comprising:
a housing;
a working, non-volatile memory disposed in the housing;
an auxiliary, non-volatile memory disposed in said housing; and
a user interface on said housing which is user operable to program a plurality of configurations and simultaneously store the configurations in said working memory and in said auxiliary memory, wherein the scanning radio receiver is configured to check radio frequencies for activity, stop on a single frequency, and receive and demodulate a radio signal on the single frequency without transmitting on any frequency, wherein each configuration comprises a set of scanning radio receiver functions which have been programmed by the user using the user interface, wherein the scanning radio receiver is workable using any of the configurations, but the user interface is useable to select which of the configurations is used by the scanning radio receiver, wherein each configuration comprises a user-selected set of frequencies to be scanned by the scanning radio receiver when that particular operating configuration is selected.

14. A scanning radio receiver as recited in claim 13, wherein each of the operating configurations comprises at least one range of frequencies to be scanned by the scanning radio receiver when that particular operating configuration is selected by the user.

15. A scanning radio receiver as recited in claim 13, wherein each of the operating configurations comprises memory labels which are in use when that particular operating configuration is selected by the user.

16. A scanning radio receiver as recited in claim 13, wherein each of the operating configurations comprises talk-group identifications which are in use when that particular operating configuration is selected by the user.

17. A scanning radio receiver as recited in claim 13, wherein the scanning radio receiver is configured such that the user interface is useable to delete configurations from said working memory and said auxiliary memory.

18. A scanning radio receiver as recited in claim 13, wherein the scanning radio receiver is configured such that the user interface is useable to move configurations in said working memory and said auxiliary memory.

19. A scanning radio receiver as recited in claim 13, further comprising a pointer which points at the selected operating configuration which is stored in said working memory and said auxiliary memory.

20. A scanning radio receiver as recited in claim 13, wherein the scanning radio receiver is non-telephonic.

21. A method for managing a plurality of operating configurations of a scanning radio receiver for scanning a plurality of radio frequencies and tuning said scanning radio receiver to each of said frequencies and, when an audio signal is detected for any one of said radio frequencies, remaining tuned to that frequency for a period of time and processing said audio signal to cause said scanning radio receiver to play said audio signal for said period of time, said scanning radio receiver having a plurality of user-programmable operating functions, said scanning radio receiver, said method comprising:
providing a non-telephonic scanning radio receiver which comprises a housing, a working, non-volatile memory disposed in the housing, an auxiliary, non-volatile memory disposed in said housing; a user interface on said housing which is user operable to program functions of the scanning radio receiver, to define a first operating configuration, and store the first operating configuration in said working memory, wherein the user interface is user operable to program functions of the scanning radio receiver to define a second operating configuration, and store the second operating configuration in said auxiliary memory simultaneously with said first operating configuration being stored in said working memory, wherein the user interface is user operable to select between the first and second operating configurations, wherein each operating configuration comprises a set of scanning radio receiver functions which have been programmed by the user using the user interface, wherein the scanning radio receiver is workable using either the first or second operating configuration, but the user interface is useable to select which of the first and second operating configurations is used by the scanning radio receiver, using the user interface to store a plurality of operating configurations, each of which comprises a plurality of user programmed functions; and using the user interface to instruct the scanning radio receiver which operating configuration to use.

22. A method as recited in claim 21, further comprising using the user interface to instruct the scanning radio receiver which set of frequencies to scan.

23. A method as recited in claim 21, further comprising using the user interface to define at least one range of frequencies to be scanned by the scanning radio receiver when a particular operating configuration is selected by the user.

24. A method as recited in claim 21, further comprising using the user interface to define memory labels to be used by the scanning radio receiver when a particular operating configuration is selected by the user.

25. A method as recited in claim 21, further comprising using the user interface to define talk-group identifications to be used by the scanning radio receiver when a particular operating configuration is selected by the user.

26. A method as recited in claim 21, further comprising using the user interface to delete configurations from said working memory and said auxiliary memory.

27. A method as recited in claim 21, further comprising using the user interface to move configurations in said working memory and said auxiliary memory.

28. A method as recited in claim 21, further comprising providing that the scanning radio receiver comprises a microprocessor disposed within said housing and in communication with said working memory and said auxiliary memory, and wherein said microprocessor is configured such that the user interface is useable to manage a plurality of operating configurations stored in said working memory and said auxiliary memory.

29. A method as recited in claim 21, further comprising providing that the working memory and said auxiliary memory comprises an EEPROM.

30. A method as recited in claim 21, further comprising having the scanning radio receiver use a pointer to point at the selected operating configuration which is stored in said working memory and said auxiliary memory.

31. A method as recited in claim 21, further comprising providing that the scanning radio receiver is non-telephonic.

32. A method as recited in claim 21, further comprising providing that the scanning radio receiver is configured to check radio frequencies for activity, stop on a single frequency, and receive and demodulate a radio signal on the single frequency without transmitting on any frequency.

33. A method of operating a scanning radio receiver for scanning a plurality of radio frequencies and tuning said scanning radio receiver to each of said frequencies and, when an audio signal is detected for any one of said radio frequencies, remaining tuned to that frequency for a period of time and processing said audio signal to cause said scanning radio receiver to play said audio signal for said period of time, said scanning radio receiver having a plurality of user-programmable operating functions, said scanning radio receiver comprising:

providing the scanning radio receiver comprising a housing, a working, non-volatile memory disposed in the housing, an auxiliary, non-volatile memory disposed in said housing, and a user interface which is user operable to program a plurality of configurations and simultaneously store the configurations in said working memory and in said auxiliary memory, wherein the scanning radio receiver is configured to check radio frequencies for activity, stop on a single frequency, and receive and demodulate a radio signal on the single frequency without transmitting on any frequency, wherein each configuration comprises a set of scanning radio receiver functions which have been programmed by the user using the user interface, wherein the scanning radio receiver is workable using any of the configurations, but the user interface is useable to select which of the configurations is used by the scanning radio receiver, wherein each configuration comprises a user-selected set of frequencies to be scanned by the scanning radio receiver when that particular operating configuration is selected, using the user interface to program a plurality of configurations and simultaneously store the configurations in said working memory and in said auxiliary memory, and using the user interface to select which of the configurations is used by the scanning radio receiver, wherein each configuration comprises a user-selected set of frequencies to be scanned by the scanning radio receiver when that particular operating configuration is selected.

34. A method as recited in claim 33, further comprising providing that each of the operating configurations comprises at least one range of frequencies to be scanned by the scanning radio receiver when that particular operating configuration is selected.

35. A method as recited in claim 33, further comprising providing that each of the operating configurations comprises memory labels which are in use when that particular operating configuration is selected.

36. A method as recited in claim 33, further comprising providing that each of the operating configurations comprises talk-group identifications which are in use when that particular operating configuration is selected by the user.

37. A method as recited in claim 33, further comprising using the user interface to delete configurations from said working memory and said auxiliary memory.

38. A method as recited in claim 33, further comprising using the user interface to move configurations in said working memory and said auxiliary memory.

39. A method as recited in claim 33, further comprising having the scanning radio receiver use a pointer to point at the selected operating configuration which is stored in said working memory and said auxiliary memory.

40. A method as recited in claim 33, further comprising providing that the scanning radio receiver is non-telephonic.

41. A scanning radio receiver for scanning a plurality of radio frequencies and tuning said scanning radio receiver to each of said frequencies and, when an audio signal is detected for any one of said radio frequencies, remaining tuned to that frequency for a period of time and processing said audio signal to cause said scanning radio receiver to play said audio signal for said period of time, said scanning radio receiver having a plurality of user-programmable operating functions, said scanning radio receiver comprising:

a working, non-volatile memory, an auxiliary, non-volatile memory, and a user interface, said scanning radio receiver configured such that the user interface is useable to define set up configurations each comprising a plurality of user programmed functions, said scanning radio receiver configured such that the set up configurations are simultaneously storable in said working memory and in said auxiliary memory using the user interface, and said user interface is useable to select one of the set up configurations for use by the scanning radio receiver.

42. A scanning radio receiver as recited in claim 41, wherein each of the set up configurations comprises a user-selected set of frequencies to be scanned by the scanning radio receiver when that particular set up configuration is selected by the user.

43. A scanning radio receiver as recited in claim 41, wherein each of the set up configurations comprises at least one range of frequencies to be scanned by the scanning radio receiver when that particular set up configuration is selected by the user.

44. A scanning radio receiver as recited in claim 41, wherein each of the set up configurations comprises memory labels which are in use when that particular set up configuration is selected by the user.

45. A scanning radio receiver as recited in claim 41, wherein each of the set up configurations comprises talk-group identifications which are in use when that particular set up configuration is selected by the user.

46. A scanning radio receiver as recited in claim 41, wherein the scanning radio receiver is configured such that the user interface is useable to delete configurations from said working memory and said auxiliary memory.

47. A scanning radio receiver as recited in claim 41, wherein the scanning radio receiver is configured such that the user interface is useable to move configurations in said working memory and said auxiliary memory.

48. A scanning radio receiver as recited in claim 41, further comprising:

a microprocessor disposed within said housing and in communication with said working memory and said auxiliary memory, and wherein said microprocessor is configured such that the user interface is useable to manage a plurality of set up configurations stored in said working memory and said auxiliary memory.

49. A scanning radio receiver as recited in claim 41, further comprising a pointer which points at the selected set up configuration which is stored in said working memory and said auxiliary memory.

50. A scanning radio receiver as recited in claim 41, wherein the scanning radio receiver is non-telephonic.

51. A scanning radio receiver as recited in claim 41, wherein the scanning radio receiver is configured to check radio frequencies for activity, stop on a single frequency, and receive and demodulate a radio signal on the single frequency without transmitting on any frequency.

\* \* \* \* \*